United States Patent
Jungerman

(10) Patent No.: US 6,718,276 B2
(45) Date of Patent: Apr. 6, 2004

(54) METHOD AND APPARATUS FOR CHARACTERIZING FREQUENCY RESPONSE ON AN ERROR PERFORMANCE ANALYZER

(75) Inventor: Roger Lee Jungerman, Petaluma, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 590 days.

(21) Appl. No.: 09/727,235

(22) Filed: Nov. 29, 2000

(65) Prior Publication Data

US 2002/0065621 A1 May 30, 2002

Related U.S. Application Data

(63) Continuation-in-part of application No. 09/723,704, filed on Nov. 28, 2000, now abandoned.

(51) Int. Cl.$^7$ .............................................. G06F 19/00
(52) U.S. Cl. ........................ 702/109; 702/17; 702/79; 702/109; 702/116; 714/736; 714/746; 714/803; 708/530; 708/532; 708/531; 331/23; 331/32
(58) Field of Search ............................... 702/57, 64–66, 702/69, 75, 76, 79, 116, 124–126, 189, 194, 199, FOR 103, 104, 106–108, 110, 135, 138, 160, 164, 171, 172; 714/704, 707, 735, 736, 803; 708/531; 331/17–18, 120, 123; 324/310, 313, 364, 520, 667, 674, 681, 85, 76.19

(56) References Cited

U.S. PATENT DOCUMENTS

| | | | |
|---|---|---|---|
| 4,566,100 A | * | 1/1986 | Mizuno et al. ................. 371/5 |
| 5,856,980 A | * | 1/1999 | Doyle ......................... 371/5.1 |
| 6,076,175 A | * | 6/2000 | Drost et al. .................. 714/704 |

OTHER PUBLICATIONS

Anderson, 'Site–Specific BER Analysis in Frequency–Selective Channels Using a Ray–Tracing Propagation Model', Jan. 1994, IEEE, vol: 1820, pp. 1441–1445.*

Dresselhaus et al., 'Bit Error Rate Measurements for GHz Code Generator Circuits', Jan. 1999, IEEE, vol: 9, No. 2, 3598–3601.*

* cited by examiner

*Primary Examiner*—Marc S. Hoff
*Assistant Examiner*—Elias Desta

(57) ABSTRACT

A method and apparatus for characterizing frequency response of a device under test (DUT) is disclosed. A repeated base bit pattern is received, the base bit pattern including a first transition from a 0-bit to a 1-bit. Then, using bit error rate distribution, multivalue voltage along the first transition is determined. Finally, the multivalued voltages are converted into frequency domain using fast Fourier transform. The apparatus includes a processor and storage with instructions for the processor to perform these operations. Using the present inventive technique, the frequency response of the DUT can be determined using an error performance analyzer such as a BERT.

14 Claims, 5 Drawing Sheets

METHOD AND APPARATUS FOR CHARACTERIZING FREQUENCY RESPONSE ON AN ERROR PERFORMANCE ANALYZER

BACKGROUND

The present invention relates to error performance analyzers. This application for patent is a continuation-in-part of an application filed on Nov. 28, 2000, titled "Method And Apparatus For Characterizing Frequency Response Of An Error Performance Analyzer", Ser. No. 09/723,704, now abandoned. More specifically, the present invention relates to the method and apparatus for determining frequency response of a device under test using error performance analyzers.

A fundamental measure of quality of digital circuits, switches, and transmission systems is the probability of any stored or transmitted bit being transmitted in error, or bit error ratio (BER). The BER is typically tested using a bit error ratio tester (BERT) which may include of a pattern generator and an error detector. The pattern generator and the error detector are often combined in a single unit though this is not required and are, in fact, sometimes separate units. The pattern generator generates a known sequence of bits (sequence of zeros and ones) for transmission through a device under test (DUT). Typically, the known sequence of bits is often generated by a pseudo-random bit sequencer (PRBS) and is of known length of $2^N-1$ bits where N may be any number. For example, typical values for N are seven (7) or ten (10). For convenience, the known sequence of bits is referred to as a base bit sequence, or a base bit pattern. The base bit pattern is continually repeated by the pattern generator.

The repeated base bit pattern is transmitted to the BUT which, in turn, transmits the bit sequences to be received by the error detector. The error detector compares the received bit sequence with the known bit sequence for error bit detection. Usually, the error detector also generates the known sequence of bits, or repeated base bit pattern, such that the error detector can compare the received bit sequence with the known bit sequence to detect errors in transmission. An error bit is a bit that is sent to the DUT as a zero but transmitted by the DUT as a one, or a bit that is sent to the DUT as a one but transmitted by the DUT as a zero. Then, the number of error bits is compared with the number of bits received. The ratio of the error bits to the sent bits is the bit error ratio, BER. With modern devices, the BER tends to be very low and can be on the order of 10–12 or even less.

As discussed, an error detector provides the BER as one measure of quality of the DUT. However, to determine frequency response of the DUT, a network analyzer is typically used. A network analyzer creates a data model of the transfer characteristic of a linear network over the frequency range of interest. The uses of the network analyzer and the technique of obtaining frequency response of a DUT using the network analyzer are known in the art.

In summary, to test a DUT for its error rate as well as for frequency response, two devices are needed—a BERT and a network analyzer. However, the use of the network analyzer adds to the hardware requirements and costs to the DUT testing process. It would be preferable to analyze the frequency response of the DUT using the BERT alone. Accordingly, there is a need for a technique and an apparatus to obtain the BER as well as to obtain frequency response without the use of a network analyzer.

SUMMARY

These needs are met by the present invention. According to one embodiment of the present invention, a technique of characterizing the frequency response of a device under test (DUT) using an error performance analyzer is disclosed. First, a bit sequence comprising repeated base bit pattern, the base bit pattern having a first transition from a first bit voltage, $V_{LB}$, to a second bit voltage, $V_{HB}$ is received. Then, using bit error rate distribution, multivalue voltages along the first transition is determined. Finally, the transition voltages are converted into frequency domain to characterize frequency response of the DUT.

According to another embodiment of the present invention, an apparatus including a processor and storage connected to the processor. The storage includes instructions for the processor to receive a bit sequence comprising repeated base bit pattern, the base bit pattern having a first transition from a first bit voltage, $V_{LB}$, to a second bit voltage, $V_{HB}$. Further, the storage includes instructions for the processor to determine, using bit error rate distribution, multivalue voltages for a predetermined period of time from an initial sample time, $T_{S0}$, to a final sample time, $T_{SM}$. Finally, the storage includes instructions for the processor to convert the multivalue voltages into frequency domain to characterize frequency response of the DUT.

Other aspects and advantages of the present invention will become apparent from the following detailed description, taken in conjunction with the accompanying drawings, illustrating by way of example, the principles of the present invention.

DETAILED DESCRIPTION

Figure 1:
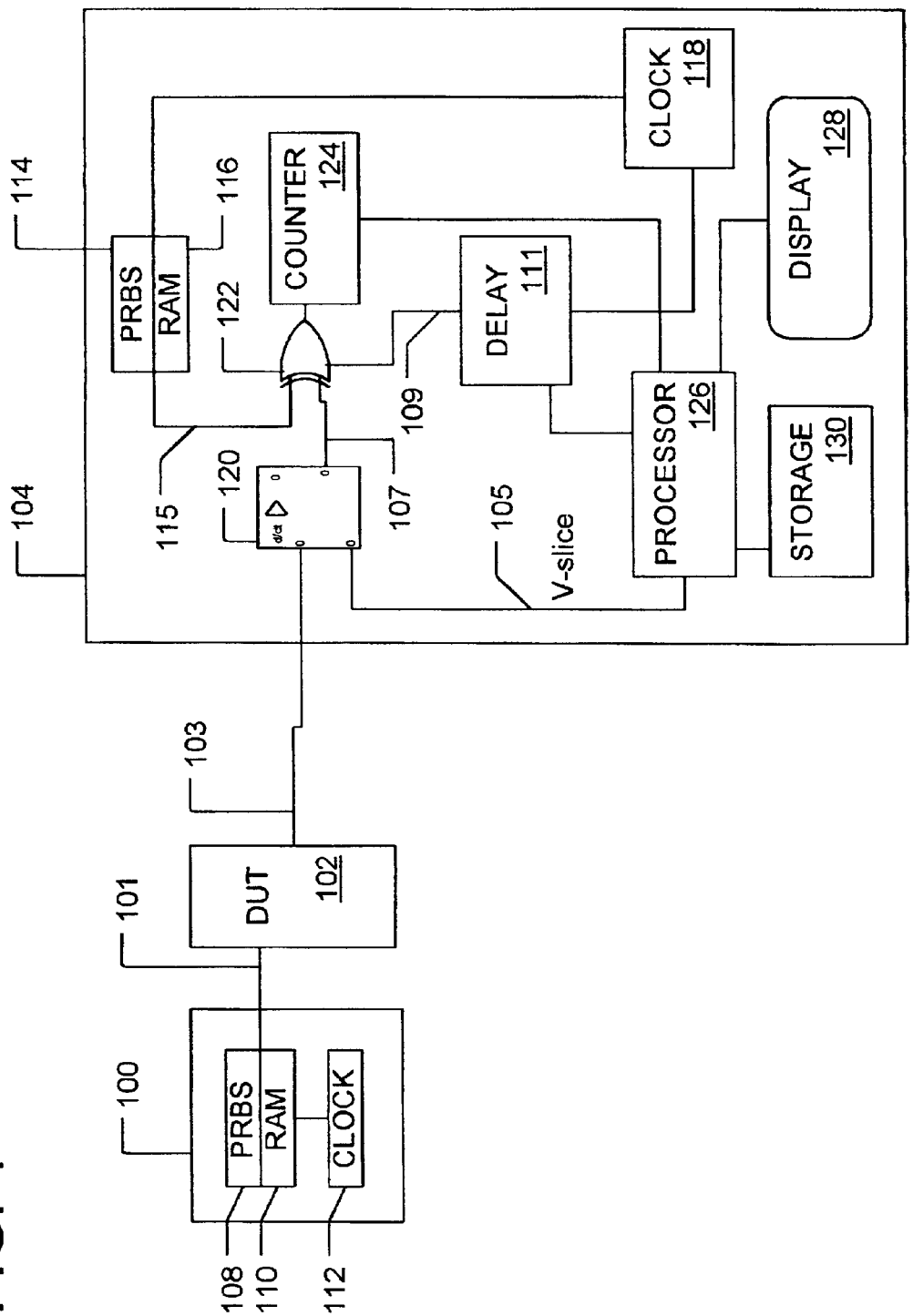
FIG. 1 illustrates a bit error rate testing configuration in simplified blocks.

As shown in the drawings for purposes of illustration, the present invention is embodied in a technique and an apparatus for determining frequency response of a device (DUT). First, a bit sequence comprising repeated base bit pattern, the base bit pattern having a first transition from a first bit voltage, $V_{LB}$, to a second bit voltage, $V_{HB}$ is received. Then, using bit error rate distribution, multivalue voltages along the first transition is determined. Finally, the transition voltages are converted into frequency domain to characterize frequency response of the DUT. Because the frequency response is obtained using the BERT alone, hardware requirements are reduced.

Bit Error Rate Testing Configuration

Referring to FIG. 1, a basic bit error rate testing configuration is illustrated in a simplified manner including a pattern generator 100, a device under test (DUT) 102, and an error detector 104. The pattern generator 100 sends 101 a repeating sequence of a base bit pattern to the DUT 102 for testing. The base bit pattern is often generated by a pseudo-random bit sequencer (PRBS) 108. Alternatively, a fixed bit sequence is stored in memory 110 and used as the base bit sequence for testing the DUT 102. The pattern generator 100 has a clock 112 to synchronize its operations including the PRBS generation and transmission 101 of the base bit patterns to the DUT 102. For convenience, the base bit sequences generated by the pattern generator 100 and transmitted to the DUT 102 are represented by line 101 of FIG. 1 and referred to by the reference number 101.

Figure 2:
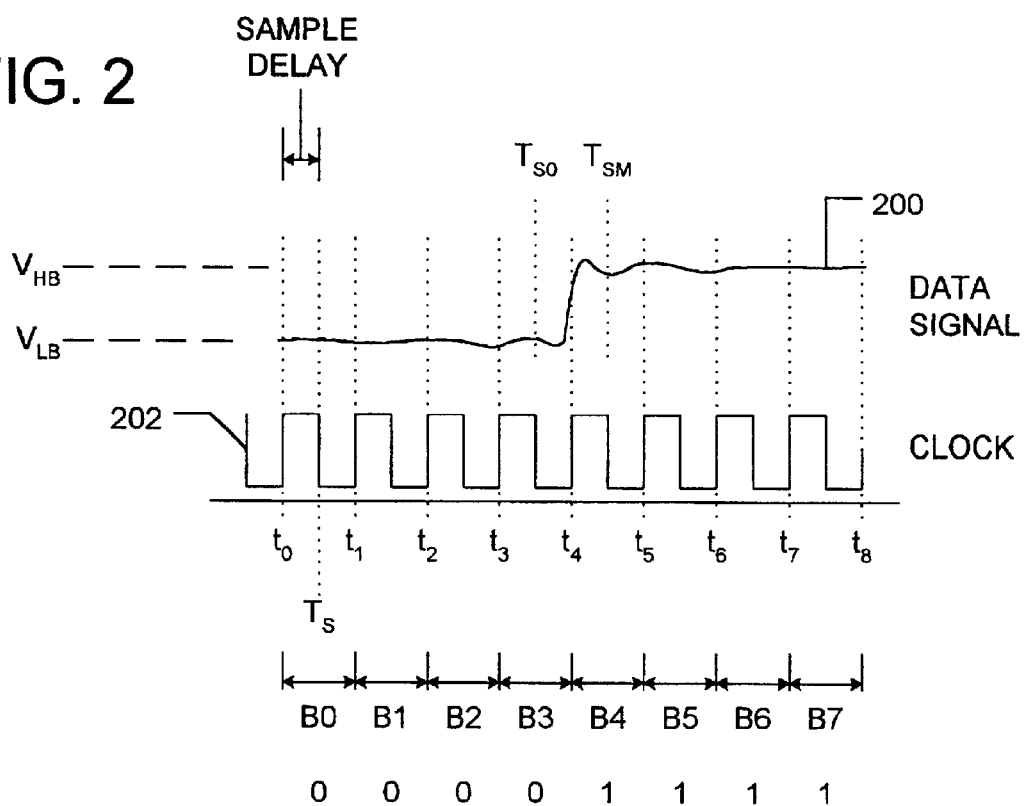
FIG. 2 illustrates a sample base bit pattern.

FIG. 2 illustrates a portion of one possible base bit sequence. The bit sequence signal 200 shows, as an example, an eight bit sequence of 00001111. A corresponding clock signal square wave 202 is also illustrated for eight clock periods—from time to $t_0$ time $t_8$. The clock signal 202 has a period of some predefined value. Accordingly, the bit sequence signal 200 has the same period as the clock signal 200 with each bit expressed within one period. The bit sequence signal 200 normally ranges from a low bit voltage, $V_{LB}$, signifying one of the two binary values (0 or 1) to a high bit voltage, $V_{HB}$, signifying the other of the two binary values (1 or 0). Each bit of the bit sequence signal 200 is either at the first bit voltage value, $V_{LB}$, representing perhaps 0 or at the second bit voltage value, $V_{HB}$, representing perhaps 1. In the present example, the clock signal 202 represents the clock signal generated by the clock 112 of the pattern generator 100 or a clock 118 of the error detector 104. Also, the bit sequence signal 200 represents a portion of the bit sequence 101 generated by the pattern generator 100 or as transmitted by the DUT 102 and received by the error detector 104.

Continuing to refer to FIGS. 1 and 2, the bit sequence 101 is transmitted through the DUT 102 and received 103 by the error detector 104. For convenience, the bit sequence transmitted from the DUT 102 and received by the error detector 104 are represented by line 103 of FIG. 1 and referred to by the reference number 103. The error detector 104 includes its own PRBS 114 or memory 116 as a source of its own bit sequences. For convenience, the bit sequence from the PRBS 114 or the memory 116 are represented by line 115 of FIG. 1 and referred to by the reference number 115. Preferably, the bit sequence 115 of the error detector 104 is also a repeating bit sequences of the base bit pattern identical to the bit sequence 101 of the pattern generator 100 such that the bit sequence 103 from the DUT is compared against the bit sequence 115 of the error detector 104 (identical to the bit sequence 101 of the pattern generator) to detect errors introduced by the DUT 102. For clarity, the bit sequence 103 received by the error detector 104 is referred to as a first bit sequence 103, and the bit sequence 115 generated by the error detector 104 is referred to as a second bit sequence 115.

The first bit sequence 103 is received by the error detector 104 as electrical signal having a voltage values of either a low bit voltage, $V_{LB}$, or a high bit voltage, $V_{HB}$. Each bit of the first bit sequence 103 is first compared with a slice voltage, $V_S$, 105 using a differential amplifier 120. Commonly, the slice voltage 105 is set between the first bit voltage value, $V_{LB}$, and the second bit voltage value, $V_{HB}$, in order to allow the differential amplifier 120 to differentiate between a 0-bit (for example, a low bit voltage signal) and a 1-bit (for example, a high bit voltage signal). After the differential amplifier 120 translates the incoming bit 103 to a differential bit 107, the differentiated bit 107 is compared with the corresponding bit of the second bit sequence 115. Techniques to synchronize of the first bit sequence 103 to the second bit sequence 115 are well known in the art and need not be discussed here. The comparison operation is provided by an exclusive-or element 122 where if the differentiated bit 107 is different from the corresponding bit of the second bit sequence 115, then the bit is in error.

As with the pattern generator 100, the error detector 104 has a clock 118 providing a clock signal to synchronize its operations. To avoid clutter, not all connections between the clock 118 and the illustrated portions of the error detector 104 are illustrated in FIG. 1. The clock 118 may generate a clock signal similar to the clock signal 202 of FIG. 2.

Traditionally, the differentiated bit 107 is compared, or sampled, at a midpoint of the period of the bit to avoid sampling the bit during transition time. This is illustrated on FIG. 2. For example, the first bit of the bit sequence signal 200 having a period from $t_0$ to $t_1$ is sampled at a sample time, $T_S$, where the sample time, $T_S$, is in between a beginning of period time, $t_0$ and a end of period time, $t_1$. The period of time between the beginning of the period, for example, $t_0$, to the time sample is taken, for example, the sample time, $T_S$, is the sample delay. Thus, the sample time, $T_S$, is also referred to as sample delay or sampling delay. The sampling delay, $T_S$, is controlled by a processor 126 using a delay circuit 111. Using the delay circuit 111, the processor 126 determines the sample time, $T_S$, when the sample of the translated bit is taken by controlling the sample delay relative to the beginning of the bit period. The sample time, $T_S$, is referred herein by the reference numeral 109. A counter 124 counts the error bits.

The processor 126 also sets the slice voltage 105, read the counter 124, and display the resulting frequency response curves, determined as discussed herein below, using a display 128. The processor 126 is connected to storage 130 for storage of various values during the operation of the processor 126.

The bit sequence signal 200 of FIG. 2 represents a sample base bit pattern having eight bits 10110010, each bit identified as B0, B1, B2, . . . to B7. In computing technology, it is customary to count beginning at number zero; thus, the first bit is bit B0 and the eighth bit is bit B7. As already discussed, in practice, the base bit pattern is typically $2^7-1$ bits or longer; however, the bit pattern 200 of FIG. 2 is used herein as a sample base bit pattern for the purposes of illustrating the present invention. A period of time from an initial sample time, $T_{S0}$, to a final sample time, $T_{SM}$, may represent the transition between the second bit (B1, a 0-bit) and the third bit (B2, a 1-bit), including portions of B1 and B2, of the base bit pattern 200 of FIG. 2. Here, the initial sample time, $T_{S0}$, is referred to as the beginning time, or the first time and the final sample time, $T_{SM}$, is referred to as the ending time of the transition period.

Figure 3:
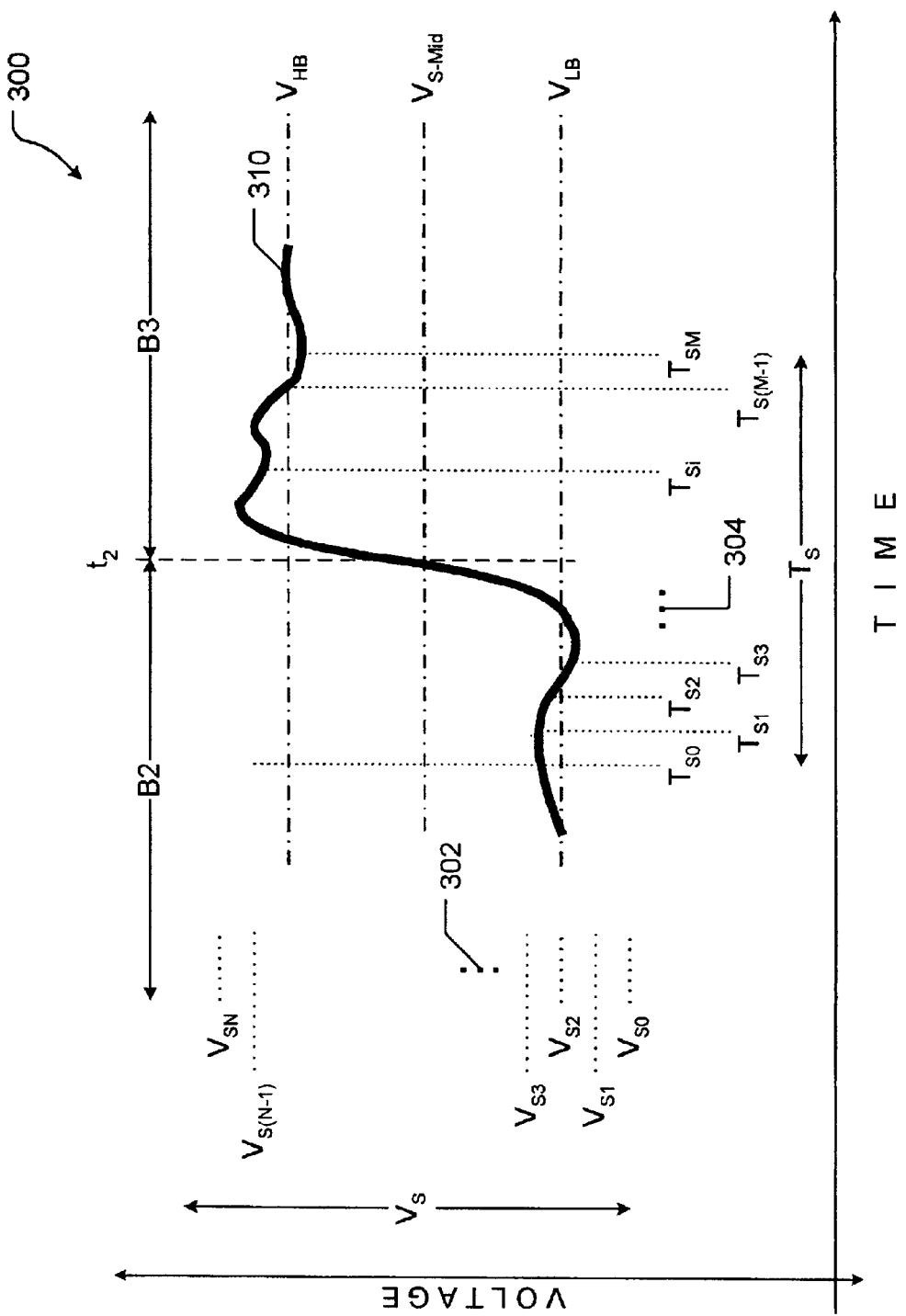
FIG. 3 illustrates a portion of the sample base bit pattern of FIG. 2.

FIG. 3 illustrates a transition 300 that is used to further discuss the present invention. The transition signal curve 310 represents the transition portion from the initial sample time, $T_{S0}$, to the final sample time, $T_{SM}$, of the sample base bit pattern 200 of FIG. 2. Referring to FIG. 3, the transition 300 of FIG. 3 shows an overlay of many instances of the transition period as the base bit pattern 200 of FIG. 2 is repeatedly transmitted by the DUT 102 and received by the error detector 104.

Parts of the waveform curve 310 are at or near a first voltage value $V_{LB}$ (representing perhaps a 0-bit value), at or near a second voltage value $V_{HB}$ (representing perhaps a 1-bit value), or anywhere in between. To differentiate the bit value, a differential amplifier 120 is used in the manner illustrated in FIG. 1 and discussed above. Referring to FIGS. 1 and 3, to merely distinguish the bit value as either a 0-bit or a 1-bit, the slice voltage, $V_S$, 105, is set to a value at or near the midpoint between the first voltage value, $V_{LB}$, and the second voltage value, $V_{HB}$, as illustrated in FIG. 3 as $V_{S\text{-}Mid}$. The slice voltage, $V_S$, 105 can be set at any voltage including values less than the first voltage value, $V_{LB}$, or greater than the second voltage value, $V_{HB}$. Likewise, to merely distinguish the bit value as either a 0-bit or a 1-bit, the sample delay, $T_S$, 109 can be set at or near the midpoint between a clock period as illustrated in FIG. 2. However, note that the sample delay, $T_S$, 109 can be set at any value.

In order to determine voltages along the transition curve 310 using a BERT, voltage level of the transition curve 310 at the initial sample time, $T_{S0}$, and each incremental time thereafter to the final sample time, $T_{SM}$, is determined. Since the voltage levels are determined using multiple instances of the base bit pattern, the voltage level of the transition curve 310 at instant in time is referred herein as a multivalue voltage, $V_M$. To determine voltages along the transition curve 310 between the initial sample delay, $T_{S0}$, and the final sample delay, $T_{SM}$, the multivalue voltage, $V_M$, at $T_{S0}$ and at each incremental time thereafter to the final sample time, $T_{SM}$, is found as further explained below.

Determining the Multivalue Voltage, $V_M$

Figure 4A:
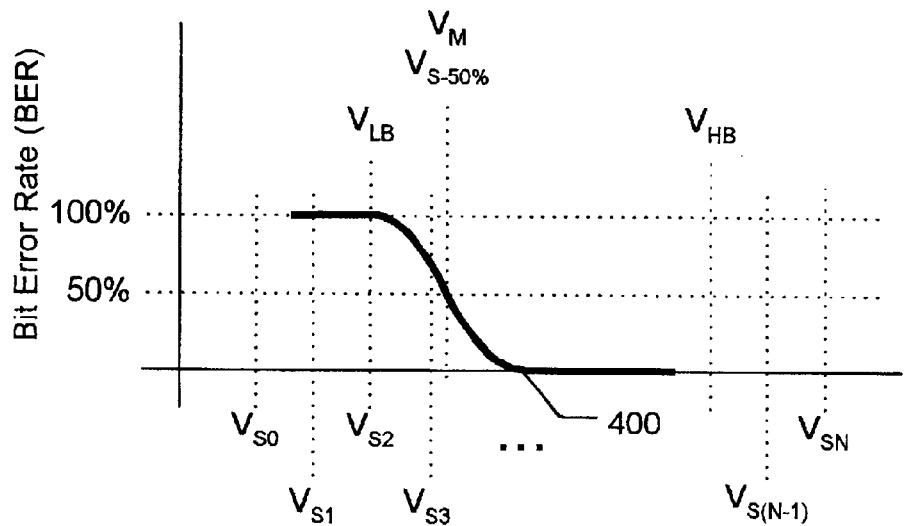
FIG. 4A illustrates a bit error rate (BER) curve constructed in accordance with an embodiment of the present invention.

To determine the multivalue voltage, $V_M$, at a particular sampling delay time $T_{S0}$, first, a BER curve is constructed at the $T_{S0}$. FIG. 4A illustrates a sample BER curve 400. Referring to FIGS. 1, 3, and 4A, to construct the BER curve 400, the slice voltage, $V_S$, 105 is set at an initial slice voltage, $V_{S0}$, and increased incrementally to a final slice voltage, $V_{SN}$, where the initial slice voltage, $V_{S0}$, is less than the first voltage value, $V_{LB}$, and the final slice voltage, $V_{SN}$, is greater than the second voltage value, $V_{HB}$. The number, N, of increments of the slice voltage, $V_S$, between $V_{S0}$ and $V_{SN}$ is arbitrary. Incremental slice voltages are indicated in FIG. 3 by slice voltage levels $V_{S0}$, $V_{S1}$, $V_{S2}$, ellipsis 302, $V_{S(N-1)}$, and $V_{SN}$.

At each increment of the slice voltage $V_S$, including at the first increment $V_{S0}$, BER is taken for a predetermined number of repeats of that particular bit. In the present 8-bit base bit pattern example, at the initial sample time, $T_{S0}$ the particular bit under consideration is the fourth bit, B3, of the 8-bit base bit pattern having value of a 0-bit at voltage level of the first voltage value, $V_{LB}$. Therefore, the BER is taken for a predetermined number of repeats of the bit B3. At the initial slice voltage, $V_{S0}$, most or all bit signal values, including the B3 signal values translate (by the differential amplifier 120) to a 1-bit because all incoming bits have signal values higher than the initial slice voltage, $V_{S0}$. Thus, the BER of the fourth bit at the initial sample time, $T_{S0}$ using the slice voltage of the initial slice voltage, $V_{S0}$, is at 100%. That is, all instances of bit B3 are translated, in error, as a 1-bit. As the slice voltage, $V_S$, incrementally increases and passes the actual voltage value of bit B3 (which, in the present example, is slightly above the first voltage value $V_{LB}$), the BER decreases and eventually becomes zero percent. As the slice voltage, $V_S$, approaches and passes the actual voltage value of bit B3, an increasing percentage of instances of B3 (a 0-bit) bits falls under the slice voltage, $V_S$, and therefore are correctly counted as 0-bits. Thus, the number of bit errors decreases to zero as the slice voltage, $V_S$, passes the actual voltage value of bit B3. As the slice voltage, $V_S$, moves well beyond the actual voltage value of bit B3, the BER remains at zero because the differential amplifier 120 correctly translates bit B3 as a 0-bit. This behavior of the BER curve for bit B3 is illustrated as BER curve 400 of FIG. 4A. At the initial slice voltage, $V_{S0}$, the BER for bit B3 is at 100%. As the slice voltage, $V_S$, moves to and passes the actual voltage value of bit B3 (slightly over the first voltage value $V_{LB}$ in the present example), the BER decreases and drops to zero.

Figure 4B:
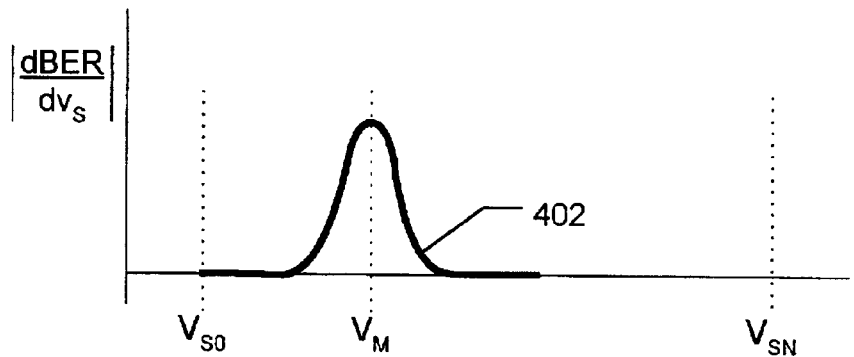
FIG. 4B illustrates a BER-derivative curve representing derivative of the BER curve of FIG. 4A.

In one embodiment, the multivalue voltage, $V_M$, is determined to be the slice voltage where the BER value is at 50%. In another embodiment, the multivalue voltage, $V_M$, is determined to be where the BER curve has the steepest transition from the 100% to 0%. This is ascertained by taking a derivative of the BER curve 400 and is illustrated as the BER-derivative curve 402 of FIG. 4B. For convenience of working with the values, absolute value of the derivative of the BER curve is used for the present example. FIG. 4B illustrates the absolute value BER-derivative curve 402 (herein after the "BER-derivative curve" or "dBER/dv"). Referring to FIGS. 4A and 4B, The BER-derivative curve 402 has zero value around the initial slice voltage, $V_{S0}$, and well beyond the actual voltage value of bit B3 because the BER curve 400 is flat around these regions. At the actual voltage value of bit B3, the BER-derivative curve has the greatest value. Ideally, this is the same voltage as the first voltage value $V_{LB}$; however, in practice, this is rarely the case. In one embodiment, the slice voltage at which the BER-derivative curve has the greatest value is considered the multivalue voltage $V_M$.

The multivalue voltages, $V_M$, for the entire transition period between the initial sample time, $T_{S0}$, and the final sample time, $T_{SM}$, are determined by repeating the above procedure for each incremental time delay spanning the time period. For example, the above technique can be repeated at incremental delay times $T_{S1}$, $T_{S2}$, etc. to the final sampling time, $T_{SM}$, where M is the number of increments in the time period. Incremental delay times for sampling are indicated in FIG. 3 by delays $T_{S0}$, $T_{S1}$, $T_{S2}$, ellipsis 304, $T_{S(M-1)}$, and $T_{SM}$.

Converting Multivalue Voltage, $V_M$, to Frequency Response

Once the voltages along the transition curve 310 of FIG. 3 are determined as a set of multivalue voltage, $V_M$, measurements at each incremental time for the transition period from the initial sample time, $T_{S0}$, to the final sample time, $T_{SM}$, the transition curve, as represented by the set of multivalue voltage, $V_M$, values, is converted into the frequency domain by the application of fast Fourier transform (FFT) to the multivalue voltage, $V_M$, values.

Figure 5:
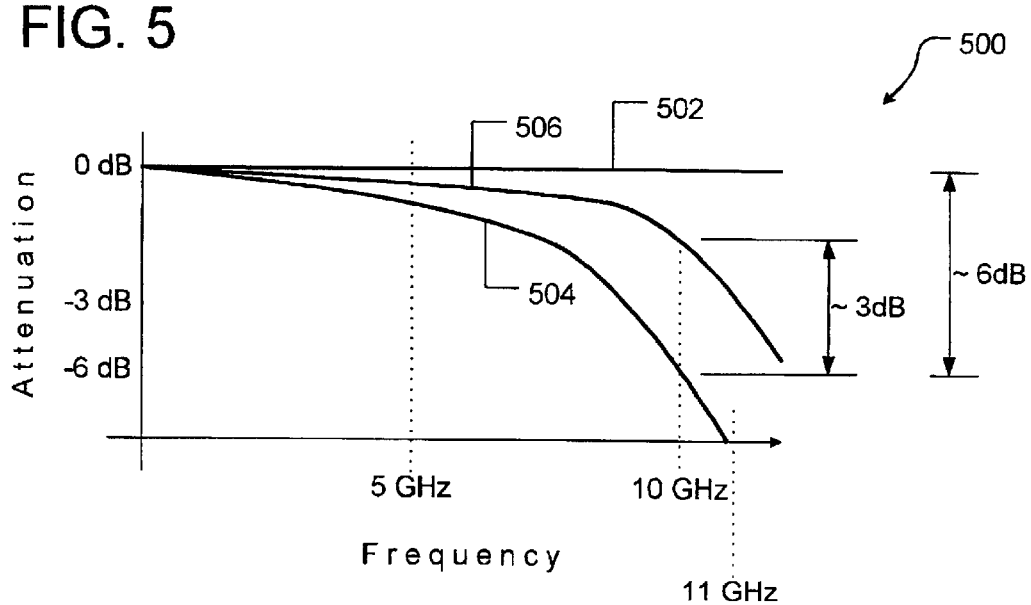
FIG. 5 illustrates frequency response curves.

FIG. 5 illustrates frequency domain curves. Referring to FIG. 5, the horizontal axis of the graph 500 represent the frequency. In this case, the frequency is illustrated from 0 Hz to over 10 GHz. The vertical axis represent the signal degradation in logarithmic scale with 0 dB representing no signal degradation and greater degradation as a curve moves down the axis. A first frequency response curve 500 represents a perfect frequency response with no signal degradation. A second frequency response curve 504 represents frequency response obtained by the application of the FFT to the transition signal curve 310 of FIG. 3. As illustrated by the second curve 504, for the lower frequency components, the signal degradation is relatively small. However, for higher frequency components, the signal degradation increases to the point where above 11 GHz, all signal is substantially lost.

Referring to FIG. 5 and also referring to FIG. 1, the second curve 504 in the present example represents the frequency response of the DUT 102 obtained by the analysis of the signal 103 as received by the error detector 104. However, a portion of the signal degradation reflected by the frequency response curve 504 may not be due to the DUT 102 but may be attributable to the pattern generator 100, the error detector 104, or both. To account for this and other signal degradation (not due to the DUT 102), a third frequency response curve 506 is obtained by connecting the output 101 of the pattern generator 100 directly to the error detector 104. In the present example, the third frequency response curve 506 represents the frequency response of the basic bit error rate testing configuration illustrated in FIG. 1 were the pattern generator 100 directly connected to the error detector 104 and not connected through the DUT 102.

The second frequency response curve 504 is normalized to eliminate the signal degradation effects of the pattern generator 100 and the error detector 104 to obtain a more correct frequency response of the DUT 102. For instance, without the normalization, the second frequency response curve 504 shows that, at 10 GHz, the DUT 102 degrades the signal 6 dB. However, second frequency response curve 504 may be normalized by the third frequency response curve 506. After the normalization, it is evident, in the illustrated example, that, at 10 GHz, the DUT 102's degradation of the signal is only 3 dB.

Apparatus

Referring again to FIG. 1, the apparatus 104 according to the present invention has the processor 126 and storage 130. The storage 130 includes instructions for the processor to utilize the all other portions of the error detector 104 to perform the operations described herein above to receive a bit sequence comprising repeated base bit pattern, the base bit pattern having a first transition from a first bit voltage, $V_{LB}$, to a second bit voltage, $V_{HB}$. The storage 130 further includes instructions for the processor to determine, using bit error rate distribution, multivalue voltages for a predetermined period of time from the initial sampling time, $T_{S0}$, to the final sampling time, $T_{SM}$. Finally, the storage 130 includes instructions for the processor to convert the multivalue voltages into frequency domain to characterize frequency response of the DUT.

From the foregoing it will be appreciated that the above described technique and apparatus for determining frequency response of a DUT reduce hardware requirements because an error performance analyzer such as a BERT can be used to characterize the frequency response of a DUT. Although specific embodiments of the present invention have been described and illustrated, the invention is not to be limited to the specific forms or arrangements of parts so described and illustrated. The invention is limited only by the claims.

What is claimed is:

1. A method of characterizing frequency response of a device under test (DUT), the method comprising:
   a. receiving a bit sequence comprising repeated base bit pattern, the base bit pattern having a first transition from a first bit voltage, VLB, to a second bit voltage, VHB;
   b. determining, using bit error rate distribution, multivalue voltages along the first transition; and
   c. converting the transition voltages into frequency domain to characterize frequency response of the DUT.

2. The method recited in claim 1 wherein the base bit pattern includes a series of 0-bits at the first bit voltage followed by a series of 1-bits with one transition between the 0-bit series and the 1-bit series.

3. The method recited in claim 1 wherein the multivalue voltages are determined by constructing a bit error rate (BER) curve at incremental points along the first transition, the BER curve spanning a range of voltages from a low slice voltage to a high slice voltage wherein the low slice voltage is less than the first bit voltage and wherein the high slice voltage is greater than the second bit voltage.

4. The method recited in claim 3 wherein the multivalue voltage at any incremental time along the first transition is a slice voltage at which the BER is at 50 percent.

5. The method recited in claim 3 wherein the multivalue voltage at any incremental time along the first transition is a slice voltage at which absolute value of derivative of the BER curve is greatest.

6. The method recited in claim 1 wherein the multivalue voltages are converted into frequency domain by application of fast Fourier transform (FFT) process to the multivalue voltages.

7. The method recited in claim 1 further comprising the step of normalizing the characterized frequency response.

8. An apparatus for displaying a waveform diagram, the apparatus comprising:
   a processor;
   storage connected to the processor, the storage including instructions for the processor to
     a. receive a bit sequence comprising repeated base bit pattern, the base bit pattern having a first transition from a first bit voltage, VLB, to a second bit voltage, VHB;
     b. determine, using bit error rate distribution, multivalue voltages for a predetermined period of time from an initial sampling time, TS0, to a final sampling time, TSM; and
     c. convert the multivalue voltages into frequency domain to characterize frequency response of the DUT.

9. The apparatus recited in claim 8 wherein the base bit pattern includes a series of 0-bits at the first bit voltage followed by a series of 1-bits with one transition between the 0-bit series and the 1-bit series.

10. The apparatus recited in claim 8 wherein the storage further comprises instructions for the processor to determine the multivalue voltages by constructing a bit error rate (BER) curve at incremental points along the first transition, the BER curve spanning a range of voltages from a low slice voltage to a high slice voltage wherein the low slice voltage is less than the first bit voltage and wherein the high slice voltage is greater than the second bit voltage.

11. The apparatus recited in claim 10 wherein the multivalue voltage at any incremental time along the first transition is a slice voltage at which the BER is at 50 percent.

12. The apparatus recited in claim 10 wherein the multivalue voltage at any incremental time along the first transition is a slice voltage at which absolute value of derivative of the BER curve is greatest.

13. The apparatus recited in claim 8 wherein the storage further comprises instructions for the processor to convert the multivalue voltages into frequency domain by application of fast Fourier transform (FFT) process to the multivalue voltages.

14. The apparatus recited in claim 8 wherein the storage further comprises instructions for the processor to normalize the characterized frequency response.

* * * * *